United States Patent [19]
Lin

[11] Patent Number: 5,920,772
[45] Date of Patent: Jul. 6, 1999

[54] METHOD OF FABRICATING A HYBRID POLYSILICON/AMORPHOUS SILICON TFT

[75] Inventor: Kang-Cheng Lin, Hsin-Chu, Taiwan

[73] Assignee: Industrial Technology Research Institute, Hsinchu, Taiwan

[21] Appl. No.: 08/884,577

[22] Filed: Jun. 27, 1997

[51] Int. Cl.$^6$ .......................... H01L 21/336; H01L 21/84
[52] U.S. Cl. .......................... 438/158; 438/159; 438/166; 438/486; 438/487
[58] Field of Search ...................................... 438/158, 166, 438/159, 486, 487; 257/59, 72, 57, 66, 75

[56] References Cited

U.S. PATENT DOCUMENTS

| | | | |
|---|---|---|---|
| 4,581,620 | 4/1986 | Yamazaki et al. | |
| 5,262,350 | 11/1993 | Yamazaki et al. | |
| 5,536,932 | 7/1996 | Hack et al. | 250/208.1 |
| 5,585,647 | 12/1996 | Nakajima et al. | 257/72 |
| 5,604,360 | 2/1997 | Zhang et al. | 257/72 |
| 5,614,729 | 3/1997 | Ukai et al. | 257/57 |
| 5,648,662 | 7/1997 | Zhang et al. | 257/59 |
| 5,717,223 | 2/1998 | Hack et al. | 257/57 |
| 5,728,610 | 3/1998 | Gosain et al. | 438/158 |
| 5,733,804 | 3/1998 | Hack et al. | 438/158 |

*Primary Examiner*—Mary Wilczewski
*Attorney, Agent, or Firm*—Tung & Associates

[57] ABSTRACT

The present invention discloses a hybrid polysilicon/amorphous silicon TFT device for switching a LCD and a method for fabrication wherein a $n^+$ doped amorphous silicon layer is advantageously used as a mask during a laser annealing process such that only a selected portion of a hydrogenated amorphous silicon layer is converted to a crystalline structure while other portions retain their amorphous structure. As a result, a polysilicon TFT and at least one amorphous silicon TFT are formed in the same structure and the benefits of both a polysilicon TFT and amorphous silicon TFT such as a high charge current and a low leakage current are retained in the hybrid structure.

17 Claims, 3 Drawing Sheets

METHOD OF FABRICATING A HYBRID POLYSILICON/AMORPHOUS SILICON TFT

FIELD OF THE INVENTION

The present invention generally relates to a thin film transistor (TFT) as a switching device for a liquid crystal display (LCD) and a method of fabrication and more particularly, relates to a hybrid polysilicon/amorphous silicon TFT for switching a LCD device which retains the benefits of both a polysilicon TFT and an amorphous silicon TFT of a high charge current and a low leakage current.

BACKGROUND OF THE INVENTION

In recent years, large liquid crystal cells have been used in flat panel displays. The liquid crystal cells are frequently constructed by two glass plates joined together with a layer of a liquid crystal material sandwiched thereinbetween. The glass substrates have conductive films coated thereon with at least one of the substrates being transparent. The substrates are connected to a source of power to change the orientation of the liquid crystal material. One of such source of power is a thin film transistor that is used to separately address areas of the liquid crystal cells at very fast rates. The TFT driven liquid crystal cells are useful in active matrix displace such as for television and computer monitors.

As the requirements for resolution of liquid crystal monitors increase, it becomes desirable to address a large number of separate areas of a liquid crystal cell, called pixels. In a modern display panel, more than 100,000 pixels may be present. It requires at least the same number of transistors to be formed on the glass plates so that each pixel can be separately addressed and left in the switched state while other pixels are addressed.

Thin film transistors are frequently made with either a polysilicon material or an amorphous silicon material. For TFT structures that are made of amorphous silicon material, a common structure is the inverted staggered type which can be back channel etched. The performance of a TFT and its manufacturing yield or throughput depend on the structure of the transistor. For instance, the inverted staggered back channel etched TFT can be fabricated with a minimum number of six masks, whereas other types of inverted staggered TFT require a minimum number of nine masks. The specification for a typical inverted staggered back channel etched TFT includes an amorphous silicon having a thickness of 3,000 Å, a gate insulator of silicon nitride or silicon oxide, a gate line of Mo—Ta, a signal line of Al/Mo and a storage capacitor. The requirement of a thick amorphous silicon layer in such a TFT device is a drawback for achieving a high yield fabrication process since deposition of amorphous silicon is a very slow process. A major benefit for the amorphous silicon TFT is its low leakage current which enables a pixel to maintain its voltage. On the other hand, an amorphous silicon TFT has the drawback of a low charge current (or on current) which requires an excessive amount of time for a pixel to be charged to its required voltage.

A second major type of TFT structure is made by using a polysilicon material. Polysilicon is more frequently used for displays that are designed in a small size, for instance, up to three inch diagonal for a projection device. At such a small size, it is economical to fabricate the display device on a quartz substrate. Unfortunately, large area display devices cannot be normally made on quartz substrates. The desirable high performance of polysilicon can therefore be realized only if a low temperature process can be developed to enable the use of non-quartz substrates. For instance, in a more recently developed process, large area polysilicon TFT can be manufactured at processing temperatures less than 600° C. In the process, self-aligned transistors can be made by depositing polysilicon, and then gate oxide followed by source/drain regions which are self-aligned with respect to the gate electrode. The device is then completed with a thick oxide layer, an ITO layer and aluminum contacts.

Polysilicon TFTs have the advantage of a high charge current (on current) and the drawback of a high leakage current. It is difficult to maintain the voltage in a pixel until the next charge in a polysilicon TFT due to its high leakage current. Polysilicon also allows the formation of CMOS devices, which cannot possibly be made by amorphous silicon. In a polysilicon TFT, the carrier mobility is about 6 $cm^2/Vs$ for N-channel devices so that it is suitable for displays as large as 240×320 pixel. For the fabrication of larger displays, a higher mobility can be achieved by reducing the trap density around the grain boundaries in a hydrogenation process.

FIG. 1 shows an enlarged, cross-sectional view of a conventional amorphous silicon TFT structure. Amorphous TFT 10 is built on a low cost glass substrate 12. On top of the glass substrate 12, a gate electrode 14 is first deposited of a refractory metal material such as Cr or Ta and then formed. A gate insulating layer 16 is normally formed in an oxidation process. For instance, a high density $TaO_x$ for a Ta gate is frequently formed to reduce defects such as pin holes and to improve yield. Another gate insulator layer 20 is then deposited of either silicon oxide or silicon nitride. An amorphous silicon layer 22 (non-doped) is then deposited with a $n^+$ doped amorphous silicon layer 24 deposited on top to improve its conductivity. Prior to the deposition of the doped amorphous silicon layer 24, an etch stop 26 is first deposited and formed to avoid damaging the amorphous silicon layer 22 in a subsequent etch process for a contact hole. The doped amorphous silicon layer 24 is formed by first depositing the amorphous silicon layer in a chemical vapor deposition process and then implanting ions in an ion implantation process. Boron ions are normally used to achieve $n^+$ polarity. A drain region 30 and a source region 32 are then deposited and formed with a pixel electrode layer 34 of generally ITO material deposited and formed on top. The drain region 30 and the source region 32 are normally deposited of a conductive metal layer. A suitable conductive metal can be a bilayer of Cr/Al. The structure is then passivated with a passivation layer 36.

Since both the polysilicon TFT and the amorphous silicon TFT have advantages and drawbacks, it is highly desirable that a different TFT structure can be designed which is cable of maximizing the advantages while minimizing the drawbacks.

It is therefore an object of the present invention to provide a hybrid polysilicon/amorphous silicon TFT device for switching a LCD that does not have the drawbacks or shortcomings of the conventional polysilicon TFT and amorphous silicon TFT.

It is another object of the present invention to provide a hybrid polysilicon/amorphous silicon TFT device for switching a LCD that can realize the advantages of both the polysilicon TFT and the amorphous silicon TFT.

It is a further object of the present invention to provide a hybrid polysilicon/amorphous silicon TFT device for switching a LCD that can be built on a low cost glass substrate normally used for amorphous silicon TFT.

It is another further object of the present invention to provide a hybrid polysilicon/amorphous silicon TFT device for switching a LCD that can be fabricated at a processing temperature of less than 600° C.

It is still another object of the present invention to provide a hybrid polysilicon/amorphous silicon TFT device for switching a LCD by transforming partially an amorphous silicon film to a polysilicon film.

It is yet another object of the present invention to provide a hybrid polysilicon/amorphous silicon TFT device for switching a LCD by converting partially an amorphous silicon film to a polysilicon by laser irradiation.

It is still another further object of the present invention to provide a hybrid polysilicon/amorphous silicon TFT device for switching a LCD by effectively using a $n^+$ amorphous silicon layer as a mask during a laser annealing process such that part of an amorphous silicon film retains its amorphous nature.

It is yet another further object of the present invention to provide a method for fabricating a hybrid polysilicon/amorphous silicon TFT device for switching a LCD by converting an amorphous silicon partially to polysilicon while retaining the amorphous nature of the film at selected locations.

SUMMARY OF THE INVENTION

In accordance with the present invention, a hybrid polysilicon/amorphous silicon TFT device for switching a LCD and its method of fabrication are provided. The hybrid TFT device can be advantageously fabricated by using a $n^+$ amorphous silicon layer as a mask to effectively shield an amorphous silicon layer from laser irradiation during an annealing process such that part of the amorphous silicon layer transforms to polysilicon while selected areas of the amorphous silicon layer retain its amorphous layer and thus, a hybrid polysilicon/amorphous silicon TFT device is formed by a polysilicon TFT and at least one amorphous silicon TFT in the same structure.

In a preferred embodiment, a method for fabricating a hybrid polysilicon/amorphous silicon TFT device for switching a LCD can be carried out by the operating steps of first providing a preprocessed substrate which has a gate of a first length and a first insulating layer deposited on a top surface of the substrate, then depositing a layer of amorphous silicon on top of the preprocessed substrate, then depositing a layer of a second insulating material on top of the amorphous silicon layer, then forming the second insulating layer into an insulator which has a second length, then depositing a $n^+$ doped amorphous silicon layer on top of the insulator and the amorphous silicon layer, then forming a window in the $n^+$ doped amorphous silicon layer to expose partially the insulator such that the $n^+$ doped amorphous silicon layer overlaps the two ends of the insulator, then exposing the substrate to a beam of radiation energy in a direction perpendicular to the top surface of the substrate such that the area of the amorphous silicon layer exposed by the window is converted to a crystalline state and forming a polysilicon TFT, while the area in the amorphous silicon layer not exposed by the window retains its amorphous state and forms two amorphous silicon TFTs, and then depositing a conducting layer on the top surface and forming a drain electrode and a source electrode for the hybrid TFT formed by the polysilicon and the amorphous silicon TFTs.

The present invention is further directed to a hybrid polysilicon/amorphous silicon TFT device which includes a substrate that has a gate and a first insulating layer formed thereon, a layer of hydrogenated amorphous silicon on the first insulating layer wherein the hydrogenated amorphous silicon layer has a center portion converted to a crystalline state forming a polysilicon TFT, and at least one hydrogenated amorphous silicon TFT formed by the hydrogenated amorphous silicon layer surrounding the center portion, an insulator formed of a second insulating material on the hydrogenated amorphous silicon layer, a $n^+$ doped hydrogenated amorphous silicon layer on top of the hydrogenated amorphous silicon layer and partially the insulator except a window portion exposing a center portion of the insulator which has substantially the same area as the center crystalline portion of the hydrogenated amorphous silicon layer, and electrodes for drain, source and gate for providing electrical communication to the hybrid TFT formed by the polysilicon TFT and the at least one hydrogenated amorphous silicon TFT.

BRIEF DESCRIPTION OF THE DRAWINGS

Other objects, features, and advantages of the present invention will become apparent upon consideration of the specification and the appended drawings in which.

DETAILED DESCRIPTION OF THE PREFERRED EMBODIMENT

The present invention discloses a hybrid polysilicon/amorphous silicon TFT device for switching a LCD and method of fabrication of such device. The hybrid TFT device can be advantageously fabricated by using a $n^+$ doped amorphous silicon layer as a mask and thus converting an underlying amorphous silicon layer partially to polysilicon while retaining selected portions of the amorphous silicon layer in their amorphous state. A hybrid TFT device is thus formed in the same structure by a polysilicon TFT and at least one, or preferably two amorphous silicon TFTs.

Figure 1:
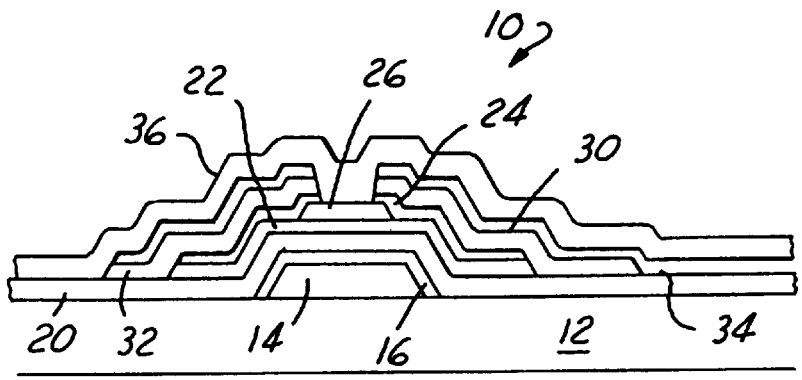
FIG. 1 is an enlarged, cross-sectional view of a conventional amorphous silicon TFT device.
Figure 2:
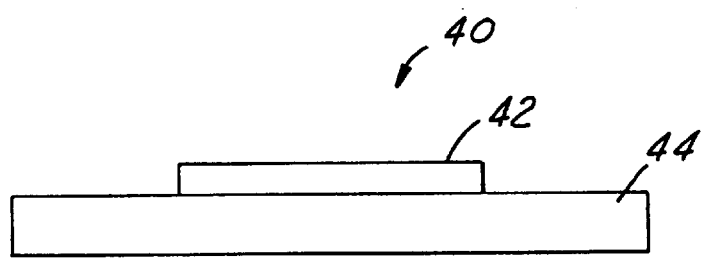
FIG. 2 is an enlarged, cross-sectional view of the present invention device after a first processing step of forming a gate electrode.

Referring initially to FIG. 2, wherein a present invention hybrid structure 40 with a gate electrode 42 deposited and formed on a glass substrate 44 is shown. The glass substrate 44 can be advantageously selected of a low cost low-sodium glass substrate since only a 350° C. processing temperature is required. The gate electrode 42 can be suitably formed of a conductive metal, and preferably from a refractory metal. Suitable candidates for such gate electrode formation is Cr, Mo, Ta or Ti. The gate electrode layer deposited is frequently referred to as a Metal 1 layer.

Figure 3:
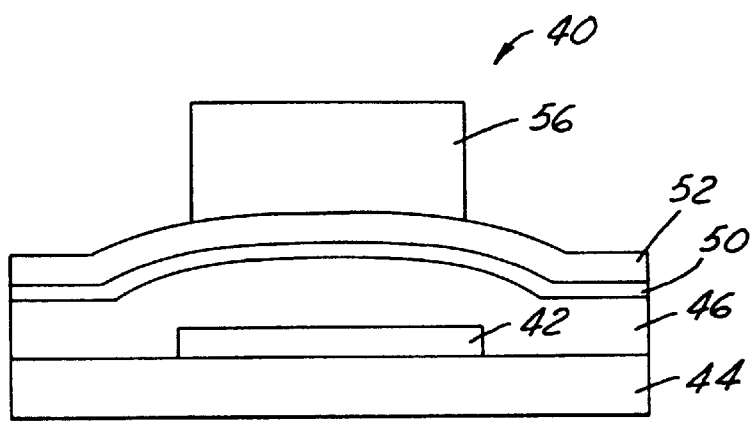
FIG. 3 is an enlarged, cross-sectional view of the present invention device of FIG. 2 having a gate insulating layer, a hydrogenated amorphous silicon layer, a second insulating layer and a photoresist layer deposited on top.
Figure 4:
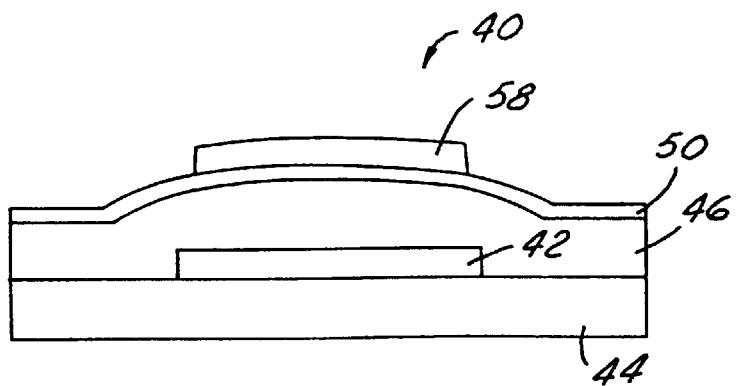
FIG. 4 is an enlarged, cross-sectional view of the present invention device of FIG. 3 having an insulator formed on top of the hydrogenated amorphous silicon layer.
Figure 5:
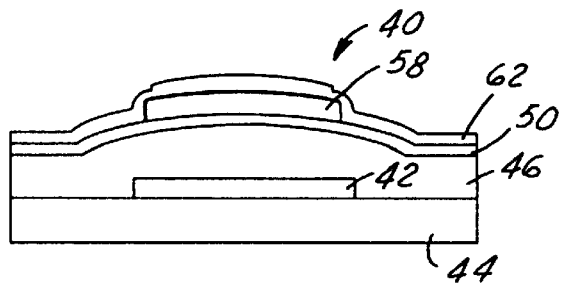
FIG. 5 is an enlarged, cross-sectional view of the present invention device of FIG. 4 having a $n^+$ doped amorphous silicon layer deposited on top.

After the gate electrode 42 is formed, a gate insulator layer 46 is deposited to insulate the gate electrode 42. The gate insulator layer 46 can be deposited suitably of an insulating material such as silicon oxide or silicon nitride by any suitable techniques. One of such suitable techniques is a chemical vapor deposition method. After the gate insulator layer 46 is deposited and defined, a first amorphous silicon layer 50 is deposited of a hydrogenated amorphous silicon material and defined. A suitable thickness for the hydrogenated amorphous silicon layer 50 is between about 20 nm and about 200 nm, and preferably between about 20 nm and about 100 nm. A second insulating layer 52 which can be deposited of a similar material like that used in the first insulating layer 46 is then deposited to a thickness normally smaller than the thickness of the first insulating layer 46. The second insulating layer 52 is then defined and a photoresist layer 56 is formed and patterned on top of the second insulating layer 52. This is shown in FIG. 3.

Figure 6:
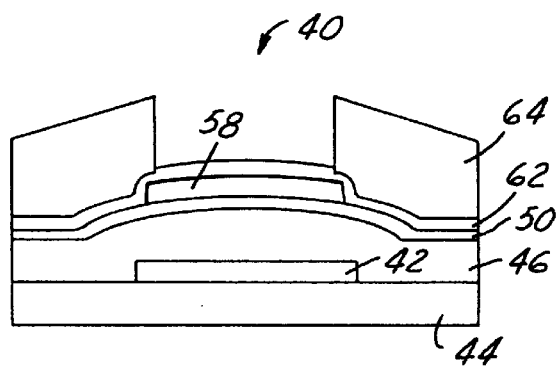
FIG. 6 is an enlarged, cross-sectional view of the present invention device of FIG. 5 having a photoresist layer deposited and patterned on top.

The photoresist layer 56 is used to form an island structure in the second insulating layer such that an island, or an insulator 58 can be fabricated. The photoresist layer 56 shown in FIG. 3 is then removed. In the next fabrication step, a second amorphous silicon layer 62 of a n⁺ doped amorphous silicon material is blanket deposited on top of the insulator 58 and the hydrogenated amorphous silicon layer 50. A suitable thickness for the n⁺ doped amorphous silicon layer 62 is between about 10 nm and about 500 nm, and preferably between about 10 nm and about 100 nm. The deposition can be carried out in a chemical vapor deposition technique followed by an ion implantation process to change its polarity and to improve its electrical conductance. A suitable ion source for achieving a n⁺ polarity is boron. Other ions such as phosphor and arsenic can be suitably used if P⁺ polarity is desired. A photoresist layer 64 is then added on top of the n⁺ doped amorphous silicon layer 62 and patterned. This is shown in FIG. 6. A second island structure is thus defined. The present invention novel method therefore does not need any additional processing step when compared to a conventional amorphous silicon TFT process. The only difference is that a n⁺ doped amorphous silicon layer is grown and patterned to be used as a novel mask for the subsequent radiation annealing process.

Figure 7:
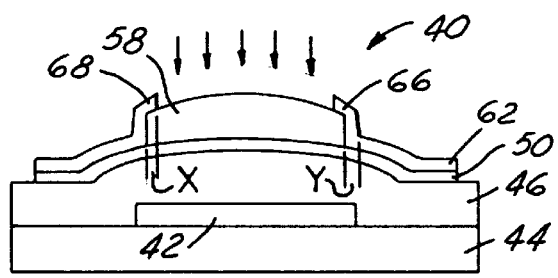
FIG. 7 is an enlarged, cross-sectional view of the present invention device of FIG. 6 having the $n^+$ doped amorphous silicon layer partially removed to expose the insulator.

In the next processing step, as shown in FIG. 7, the present invention TFT structure 40 is irradiated by a radiation source in a perpendicular direction to the top surface of the structure 40. A suitable radiation source was found to be a XeCl excimer laser, an ArF laser or a KrF laser. When a XeCl excimer laser is utilized at a wavelength of approximately 308 nm and a power of approximately 4 eV, the absorption coefficient of hydrogenated amorphous silicon material is found to be $1.5 \times 10^6$ cm$^{-1}$. It should be noted that, after the n⁺ doped amorphous silicon layer 62 is defined by the photoresist 64 (as shown in FIG. 6), small portions or tips 66 and 68 of the n⁺ doped amorphous silicon layer 62 remain on top of the insulator 58. This is done purposely such that the present invention novel hybrid structure can be fabricated.

It is a novel discovery of the present invention that a layer of n⁺ doped amorphous silicon material (such as 62 shown in FIG. 7) can be advantageously used as a mask in a laser annealing process, specifically when a XeCl excimer laser is used. It is known that the intensity of a laser beam after it penetrated a material layer can be calculated as follows:

$$\begin{aligned} I &= e^{-\alpha d} I_0 \\ &= e^{(-1.5 \times 10)(40 \times 10)} I_0 \\ &= e^{-6} I_0 \\ &= 0.0248 I_0 \end{aligned}$$

wherein I is the final intensity after penetration, $I_o$ is the initial laser intensity before penetration, $\alpha$ is the absorption coefficient for the laser radiation of the material to be penetrated (i.e., $1.5 \times 10^6$ cm$^{-1}$ for the hydrogenated amorphous silicon) and d is the thickness of the material to be penetrated.

In the present calculation, if the thickness of the n⁺ doped amorphous silicon layer 62 (which may optionally be hydrogenated) is 40 nm, then the final intensity I is 0.0248 $I_o$. It is therefore a unique discovery of the present invention that when a beam of laser radiation from a XeCl laser source, preferably at a wavelength of approximately 308 nm, is used to penetrate a n⁺ doped amorphous silicon layer of 40 nm thick, the final intensity of the laser beam is only 2.5% of the initial laser intensity. The majority of the laser radiation is absorbed by the n⁺ doped amorphous silicon material. The final, after penetration, intensity can be further reduced if a thicker material layer is penetrated. For instance, when the n⁺ doped amorphous silicon layer is 500 nm, only less than 1% of the laser radiation exists after penetration.

Figure 7A:
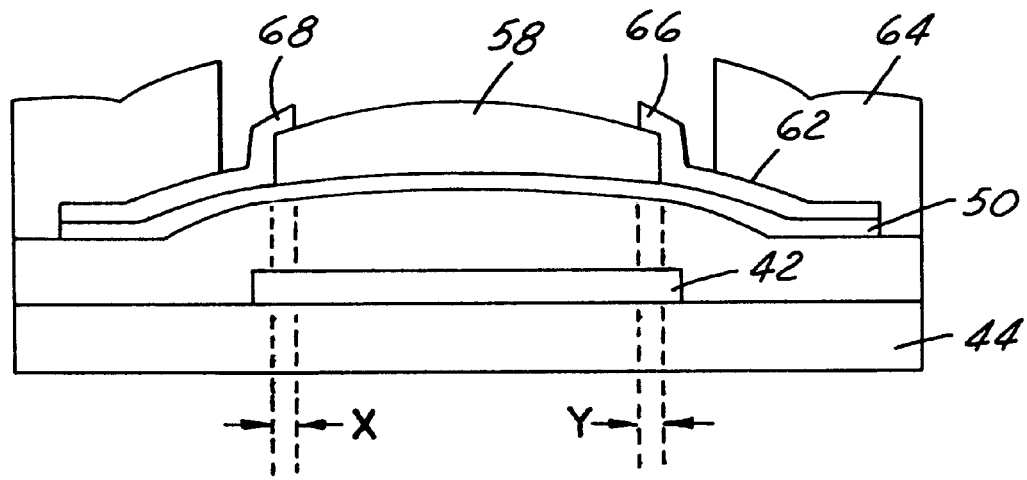
FIG. 7A is an enlarged view of FIG. 7 with the photoresist layer still remaining on top.
Figure 7B:
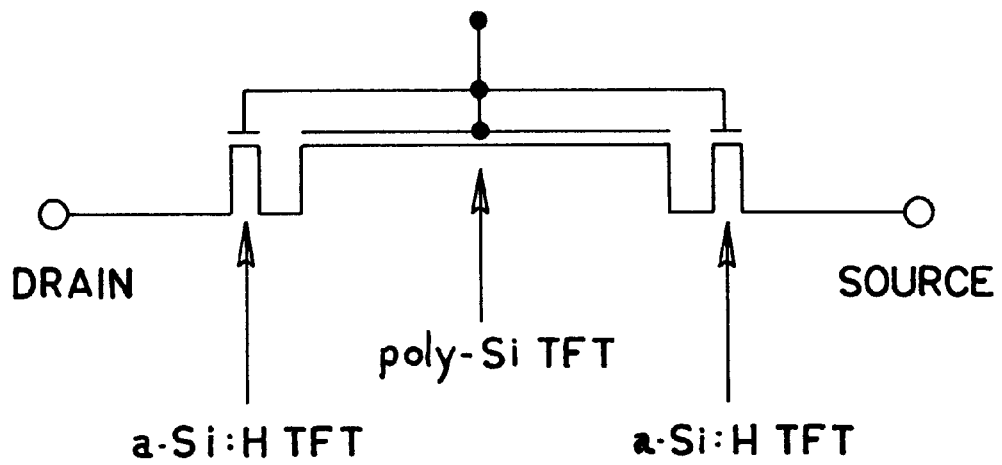
FIG. 7B is an illustration of an equivalent circuit for the structure shown in FIG. 7A.

The result achieved by the unique process of the present invention is that under the tips 66, 68 of the n⁺ doped amorphous silicon layer 62, the X and Y portion (as shown in FIGS. 7 and 7A) of the hydrogenated amorphous silicon layer 50 is not converted to a crystalline state since the laser radiation after penetration is insufficient to cause such conversion. The portions X and Y of the hydrogenated amorphous silicon layer 50 therefore retain their original amorphous state. The only area in the hydrogenated amorphous silicon layer 50 that has been converted to a crystalline state of polysilicon is the area between X and Y as shown in FIGS. 7 and 7A. An enlarged view of FIG. 7 with the photoresist layer still remaining on top is shown in FIG. 7A. FIG. 7B illustrates an equivalent circuit of the structure shown in FIG. 7A.

The present invention novel method which can be carried out is also based on the fact that the insulator 58, of a silicon oxide material is essentially transparent to the laser radiation energy. As a consequence, the portion of the hydrogenated amorphous silicon layer 50 that is directly under the insulator 58 absorbs full energy of the laser radiation and thus converts to a crystalline structure or polysilicon. As shown in FIG. 7A, the fact that the X and Y portions of the hydrogenated amorphous silicon layer 50 retain their amorphous structure enables the formation of two amorphous silicon TFTs in the same structure with the polysilicon TFT formed thereinbetween, as shown in FIG. 7B. A low leakage current in the two amorphous silicon TFTs shown in FIG. 7B is one of the major benefits made possible by the present invention novel method. The polysilicon TFT formed by the converted portion of the hydrogenated amorphous silicon layer 50 provides the benefit of a high charge current, or a high on current. The present invention novel hybrid polysilicon/amorphous silicon TFT therefore retains the benefits of both the individual polysilicon TFT and the amorphous silicon TFT.

Figure 8:
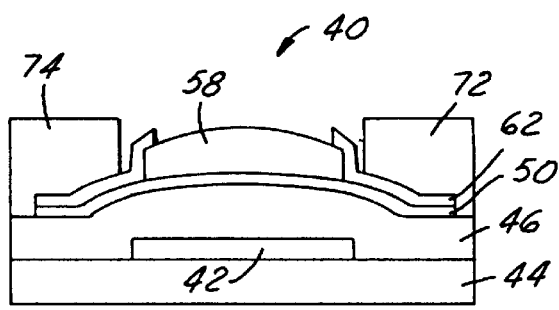
FIG. 8 is an enlarged, cross-sectional view of the present invention device of FIG. 7 having a drain electrode and a source electrode formed.
Figure 9:
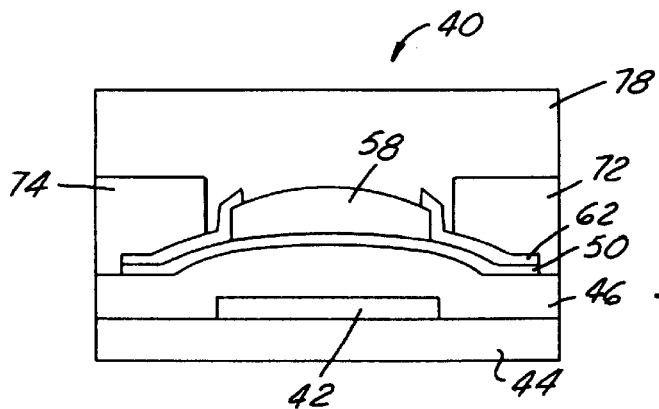
FIG. 9 is an enlarged, cross-sectional view of the present invention device of FIG. 8 having a passivation layer deposited on top.

In the next step of the process, as shown in FIG. 8, a source electrode 72 and a drain electrode 74 are formed by depositing a conductive layer such as metal on top of the structure 40 and then defined. A passivation layer 78 is finally deposited on top of the structure 40 to complete the fabrication process. This is shown in FIG. 9.

It should be noted that the ability to generate a charged current is related to the ratio between the channel width and the channel length, i.e., W/L where W is the channel width and L is the channel length. In the present invention structure as shown in FIG. 7A, the value of L becomes very small and therefore, the amorphous TFTs have a very large ratio of W/L. As a consequence, the amorphous TFTs are capable of driving a higher charge current. This is in contrary to a conventional TFT wherein the charge current is limited by the ratio of W/L and therefore it is not possible to generate a high charge current. The present invention hybrid polysilicon/amorphous silicon TFT also retains the benefit of a low leakage current based on the presence of the amorphous silicon TFT. The present invention advantageous device of a hybrid polysilicon/amorphous silicon TFT and its method of fabrication are therefore amply demonstrated by the above description and its appended drawings.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the inventions.

The embodiments of the invention in which an exclusive property or privilege is claimed are defined as follows:

1. A method of fabricating a hybrid polysilicon/ amorphous silicon thin film transistor (TFT) device for switching a liquid crystal display comprising the steps of:
   providing a preprocessed substrate having a gate of a first length and a first insulating layer deposited on a top surface,
   depositing a layer of amorphous silicon on top of said preprocessed substrate,
   depositing a second insulating layer on top of said amorphous silicon layer,
   forming said second insulating layer into an insulator having a second length,
   depositing a n$^+$ doped amorphous silicon on top of said insulator and said amorphous silicon layer,
   forming a window in said n$^+$ doped amorphous silicon layer exposing partially said insulator such that said n$^+$ doped amorphous silicon layer overlaps the two ends of said insulator,
   exposing said substrate to a beam of radiation energy in a direction perpendicular to said top surface of the substrate such that the area of said amorphous silicon layer exposed by said window being converted to a crystalline state forming a polysilicon TFT, while the area in said amorphous silicon layer not exposed by said window retains its amorphous state and forms two amorphous silicon TFTs, and
   depositing a conducting layer on said top surface and forming a drain electrode and a source electrode for the hybrid TFT formed by said polysilicon and amorphous silicon TFTS.

2. A method according to claim 1, wherein said amorphous silicon deposited on top of said preprocessed substrate is a hydrogenated amorphous silicon.

3. A method according to claim 1, wherein said first insulating layer is formed of silicon oxide or silicon nitride.

4. A method according to claim 1, wherein said second insulating layer is formed of silicon oxide or silicon nitride.

5. A method according to claim 1, wherein said second length for said insulator is substantially similar to said first length for said gate.

6. A method according to claim 1, wherein said amorphous silicon layer is deposited by a chemical vapor deposition method.

7. A method according to claim 1, wherein said n$^+$ doped amorphous silicon layer is deposited by a chemical vapor deposition method and then doped by boron.

8. A method according to claim 1, wherein said two ends of the insulator overlapped by said n$^+$ doped amorphous silicon layer after said window formation have the same length and are symmetrical to a center axis of said window.

9. A method according to claim 1, wherein the two ends of the insulator overlapped by said n$^+$ doped amorphous silicon layer each having a length substantially smaller than the length of said window.

10. A method according to claim 1, wherein said beam of radiation energy is a laser beam.

11. A method according to claim 1, wherein said beam of radiation energy is generated by an excimer laser.

12. A method according to claim 11, wherein said excimer laser is a xenon chloride laser operating at a wavelength of about 308 nm.

13. A method according to claim 1 further comprising the step of forming a gate electrode in electrical communication with said gate.

14. A method according to claim 1 further comprising the step of depositing said amorphous silicon on top of said preprocessed substrate to a thickness of between about 20 nm and about 200 nm.

15. A method according to claim 1 further comprising the step of depositing said n$^+$ doped amorphous silicon on top of said insulator and said amorphous silicon layer to a thickness between about 10 nm and about 500 nm.

16. A method according to claim 1, wherein said substrate is a substantially transparent glass substrate.

17. A method according to claim 1, wherein said gate is formed of a refractory metal.

* * * * *